US007880280B2

(12) United States Patent
Otremba

(10) Patent No.: US 7,880,280 B2
(45) Date of Patent: Feb. 1, 2011

(54) ELECTRONIC COMPONENT AND METHOD FOR MANUFACTURING AN ELECTRONIC COMPONENT

(75) Inventor: Ralf Otremba, Kaufbeuren (DE)

(73) Assignee: Infineon Technologies AG (DE)

( * ) Notice: Subject to any disclaimer, the term of this patent is extended or adjusted under 35 U.S.C. 154(b) by 883 days.

(21) Appl. No.: 11/675,924

(22) Filed: Feb. 16, 2007

(65) Prior Publication Data

US 2008/0197463 A1 Aug. 21, 2008

(51) Int. Cl.
*H01L 23/495* (2006.01)
*H01L 23/52* (2006.01)
*H01L 21/00* (2006.01)

(52) U.S. Cl. ............................ 257/676; 257/E23.031; 257/E23.019; 257/E23.142; 257/E23.001; 257/E23.034; 257/E23.044; 257/E21.001; 257/734; 257/777; 257/686; 257/685; 257/666; 257/782; 257/784; 257/796; 257/712; 257/713; 257/717; 257/720

(58) Field of Classification Search ................ 257/676, 257/723, 777, 686, 685, E23.031, 666, 782, 257/E23.019, 690, E23.142, E23.001, 784, 257/796, 712, 713, 717, 720, E23.034, E23.044, 257/E23.141, E21.001
See application file for complete search history.

(56) References Cited

U.S. PATENT DOCUMENTS 5,705,848 A 1/1998 Bayerer
6,624,522 B2 9/2003 Standing et al.
7,271,470 B1 * 9/2007 Otremba ..................... 257/666
7,615,854 B2 * 11/2009 Montgomery ............... 257/678
2006/0087026 A1 4/2006 Cao et al.

FOREIGN PATENT DOCUMENTS

DE 19612514 5/1997
DE 10301091 7/2004

* cited by examiner

*Primary Examiner*—Alexander O Williams
(74) *Attorney, Agent, or Firm*—Banner & Witcoff, Ltd.

(57) ABSTRACT

An electronic component has at least two semiconductor devices, a contact clip and a leadframe with a device carrier portion and a plurality of leads. The contact clip extends between the first side of at least two semiconductor devices and at least one lead of the leadframe to electrically connect a load electrode of the at least two semiconductor devices to at least one lead.

23 Claims, 3 Drawing Sheets

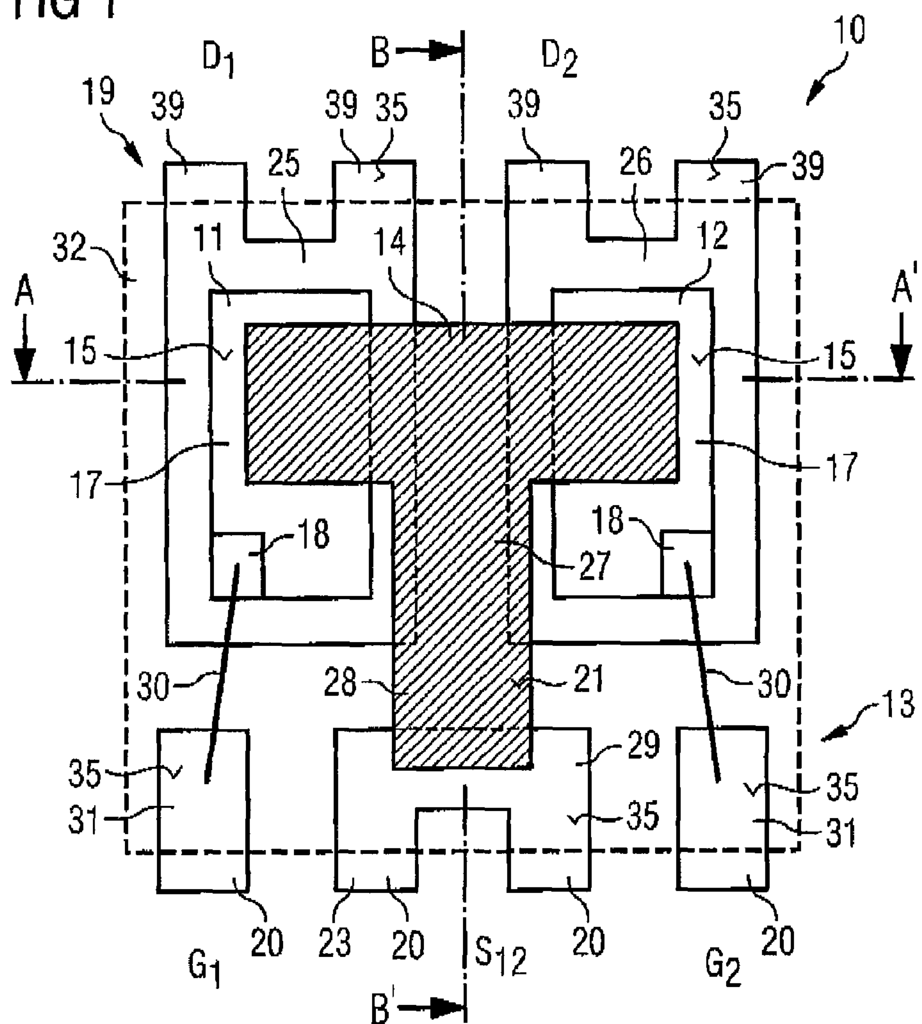
FIG 1
D1
D2
B
B'
A
A'
10
19
39
35
25
26
32
11
12
14
15
17
18
27
30
28
21
13
29
31
20
23
G1
S12
G2
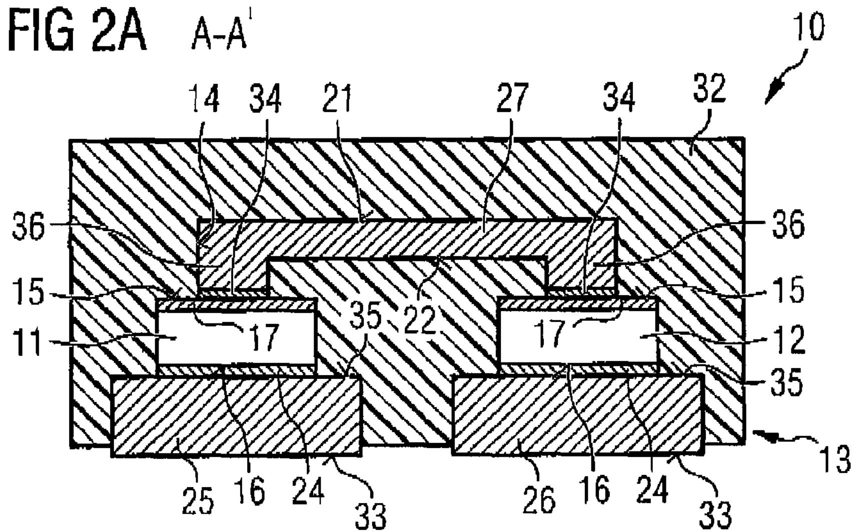
FIG 2A A-A'
10
14
34
21
27
32
36
15
11
17
35
22
12
25
16
24
33
26
13

B-B'
10
36
21
27
14
32
36
28
30
15
35
22
13
20
26
17
33
16
34
24
12
23

100
101
10
$L_1$
$D_1$
11
102
$G_1$
$V_a=1\cdot5V$
$V_e=48V$
$S_{12}$
$G_2$
12
$D_2$
$L_2$ 40
43
41
21
27
34
34
32
36
36
15
15
35
22
17
17
11
12
35
25
16
24
33
26
16
24
33

50
51
15
57
15
59
17
52
60
18
24
58
19
13
56
61
63
54
53
55

ELECTRONIC COMPONENT AND METHOD FOR MANUFACTURING AN ELECTRONIC COMPONENT

TECHNICAL FIELD

The present application relates to an electronic component, especially an electronic component comprising at least two semiconductor devices, for instance, two transistors or a transistor and a diode.

BACKGROUND

An electronic component may comprise a single semiconductor device or may comprise two or more semiconductor devices. Electronic components comprising two or more semiconductor devices are also referred to as electronic modules.

Electronic components are typically mounted on a redistribution board, such as a printed circuit board, along with further passive devices as well as further active semiconductor devices to provide a circuit which, when operating, provides a desired function, for example a dc-dc converter.

Typically, the redistribution board comprises a variety of different circuits, each comprising appropriate electronic components. The individual circuits on the redistribution board may or may not be coupled with one another.

An electronic component may be provided in the form of a package in which the semiconductor device or semiconductor devices are accommodated. The packaging is, typically, provided by a plastic encapsulation compound such as epoxy resin. The package is provided with contacts which are electrically connected to the semiconductor device by an internal rewiring structure positioned within the package. The package contacts may be provided by pins or solder balls, for example.

SUMMARY

According to an embodiment, an electronic component comprises at least two semiconductor devices, each comprising a first side and a second side which opposes the first side, wherein the first side comprises a first load electrode, wherein the first side of at least one semiconductor device further comprises a control electrode, a leadframe comprising a device carrier portion and a plurality of leads, the plurality of leads being arranged at a distance from the device carrier portion, wherein the second side of the at least two semiconductor devices is mounted on the device carrier portion of the leadframe, and a contact clip comprising an upper side and a lower side, wherein the contact clip extends between the first side of at least two semiconductor devices and at least one lead of the leadframe to electrically connect the first load electrode of the at least two semiconductor devices to the at least one lead.

BRIEF DESCRIPTION OF THE DRAWINGS

Embodiments are described hereinafter, making reference to the appended drawings.

FIG. 1 illustrates a top view of an electronic component according to an embodiment, FIG. 2*a* illustrates a cross-sectional view A-A' of the electronic component of FIG. 1.

DETAILED DESCRIPTION

Figure 2B:
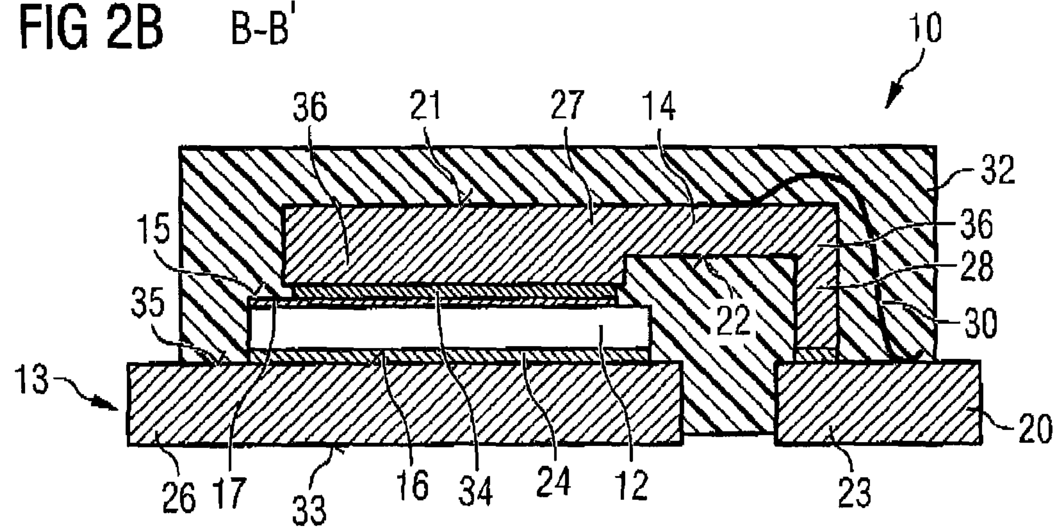
FIG. 2*b* illustrates a cross-sectional view B-B' of the electronic component of FIG. 1.
Figure 3:
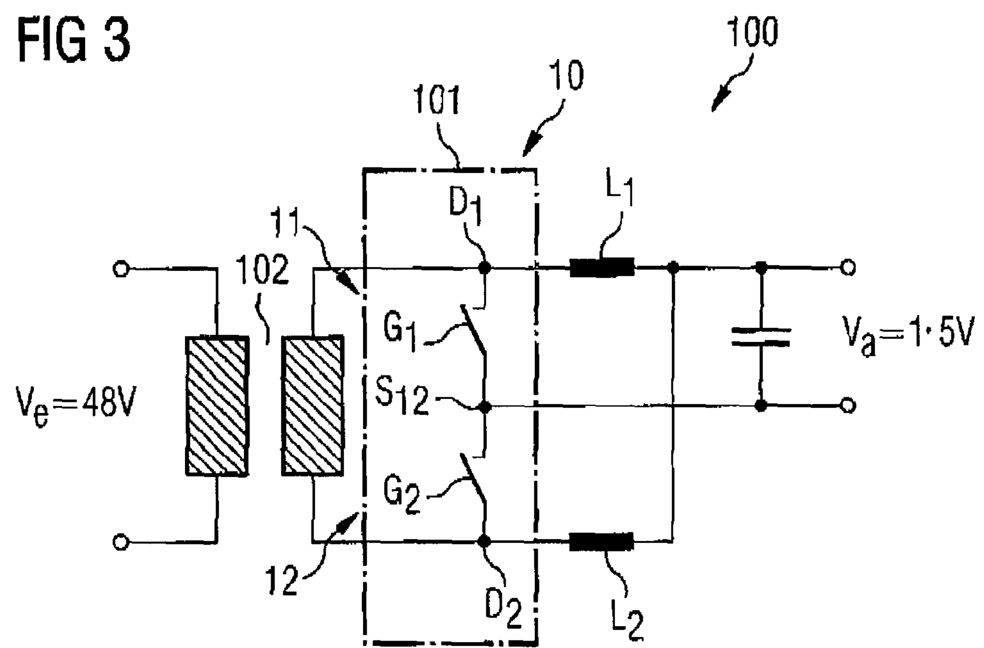
FIG. 3 illustrates a circuit comprising an electronic component according to an embodiment.
Figure 4:
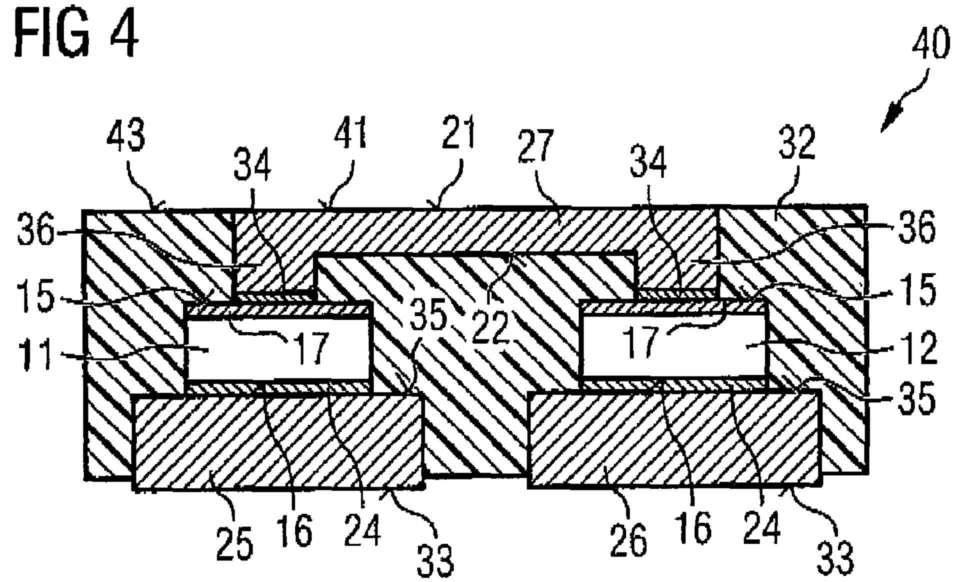
FIG. 4 illustrates a cross-sectional view of an electronic component according to an embodiment.
Figure 5:
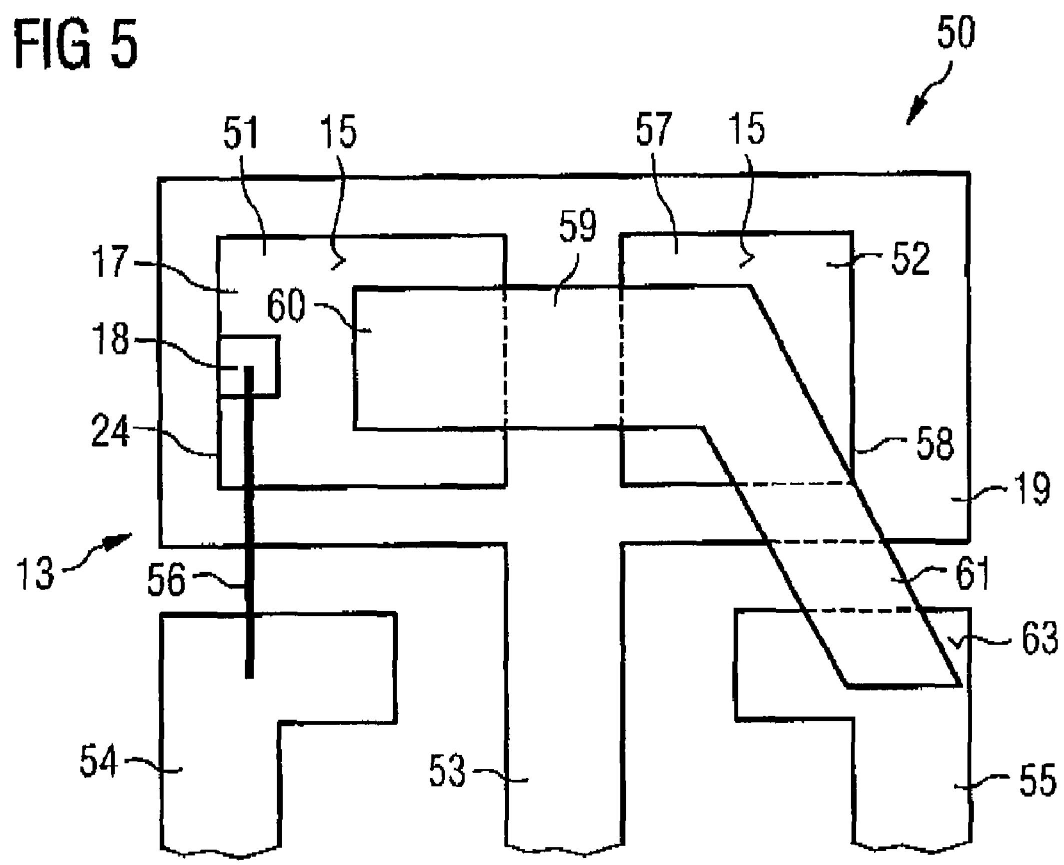
FIG. 5 illustrates a plan view of an electronic component according to an embodiment.

FIGS. 1 and 2 illustrate a plan view and a cross-sectional view of a electronic component 10 which may be used in a circuit as illustrated in FIG. 3. FIGS. 4 and 5 illustrate electronic components according to embodiments.

FIG. 1 illustrates an electronic component 10 which comprises two semiconductor devices 11, 12, a leadframe 13 and a contact clip 14. The first semiconductor device 11 comprises a first side 15 and a second side 16 which opposes the first side 15. The first side 15 of the first semiconductor device 11 comprises a first load electrode 17 and a control electrode 18. The second semiconductor device 12 comprises a first side 15 and a second side 16 which opposes the first side 15. The first side 15 of the second semiconductor device 12 comprises a first load electrode 17 and a control electrode 18. The leadframe 13 comprises a device carrier portion 19 and a plurality of leads 20 arranged at a distance from the device carrier portion 19. The second side 16 of the first semiconductor device 11 and the second side 16 of the second semiconductor device 12 are mounted on the device carrier portion 19 of the leadframe 13. The contact clip 14 comprises an upper side 21 and a lower side 22. The contact clip 14 extends between the first sides 15 of the semiconductor devices 11, 12 and a lead 23 of the leadframe 13 to electrically connect the first load electrode 17 of the first semiconductor device 11 and of the second semiconductor device 12 to the lead 23. The phrase "electrode" is used to denote a contact pad positioned on the surface of the semiconductor device which provides access to the doped regions of the body of the semiconductor device. A load electrode is typically a large area electrode which covers the majority of the side of the semiconductor device. A control electrode has a smaller area than a load electrode.

More precisely, in the present embodiment, the first semiconductor device 11 and the second semiconductor device 12 are, in each case, n-channel MOSFET transistor devices and the first load electrode 17 is the source electrode, the control electrode 18 is a gate electrode. The second side 16 of each of the first semiconductor device 11 and second semiconductor device 12 comprises a second load electrode 24 which is a drain electrode. In the embodiment illustrated in FIG. 1, the device carrier portion 19 of the leadframe 13 comprises two device carrier portions 25, 26 which are physically separate from one another. The first n-channel MOSFET device 11 is mounted on the first device carrier portion 25 and the second n-channel MOSFET device 12 is mounted on the second device carrier portion 26. The drain electrode 24 of the first n-channel MOSFET device 11 is electrically connected to the first device carrier portion 25 and the drain electrode 24 of the second n-channel MOSFET device 12 is electrically connected to the second device carrier portion 26. The contact clip 14 extends between the source electrode 17 of the first n-channel MOSFET device 11 and second n-channel MOSFET device 12.

More precisely, the contact clip 14 is a sheet of metal such as copper formed to have a web portion 27 that connects the two first load electrodes 17, in this embodiment the source electrode, of the two n-channel MOSFET devices 11, 12, and a leg portion 28 protruding from the web portion 27 which provides a contact to a lead 23 of the leadframe 13. In other words, the contact clip 14 comprises a general T-shape with the web portion 27 providing the bar of the T and the leg portion 28 protruding from the centre of the web portion 27 to provide the upright of the T.

In other embodiments which are not illustrated in the Figures, the leg portion protrudes asymmetrically from the web portion 27 so that the web portion extends different lengths from either side of the leg portion. The position of the leg portion in the web portion can be selected so as to accommodate different sizes of devices and different positions of the devices with respect to the lead of the leadframe to which the devices are electrically connected by the multi-chip contact clip.

In the present embodiment, four leads 20 are provided adjacent one side edge of the device carrier portion 19 which are spaced equidistant from one another. The four leads 20 are spaced at a distance from this side edge of the device carrier portion 19. The centre two leads 23 are connected to one another by a joining member 29 comprising an upper surface 35 which provides a contact area on which a region of the leg portion 28 of the contact clip 14 is mounted. The lead 23 comprises two leads 20 joined by the joining member 29 and provides a single or common source contact 23, S12, of the electronic component 10. The remaining two leads 20 of the leadframe 13 are positioned on each side of the source lead 23 and provide two gate leads of the electronic component 10 by which each of the gate electrodes 18 of the two n-channel MOSFET devices 11, 12 are accessible. The gate electrode 18 of the first n-channel MOSFET device 11 is electrically connected by a bond wire 30 to a first gate lead 31, G1. The gate electrode 18 of the second internal MOSFET devised 12 is electrically connected by a bond wires 30 to a second gate lead 31, G2.

The web portion 27 of the contact clip 14 extends from the first load electrode 17 of the first n-channel MOSFET device 11 to the first load electrode of the second n-channel MOSFET device 12, thereby leaving the gate electrodes 18 of the two MOSFET devices 11, 12 uncovered. The leg portion 28 of the contact clip 14 is positioned between and adjacent to the gate electrodes 18 of the two semiconductor transistor devices 11, 12.

The electronic component 10 further comprises four additional second leads 39, two of which protrude from each of the device carrier portions 25,26. More precisely, the four leads 39 produce form one side edge of the device carrier portions 25, 26 which opposes the side edge adjacent to which the four leads 20 are positioned. The second leads 39 protrude from the device carrier portions 25, 26 and are integral with the device carrier portions 25, 26.

The electronic component 10 further comprises plastic encapsulation compound 32 which encapsulates the semiconductor devices 11, 12 and at least the upper surface 35 of the device carrier portion 19 and upper surface 35 of at least portions of the leads 20, 39 of the leadframe 13. The distal ends of the leads 20 and of the second leads 39 protrude from the side face of the plastic encapsulation compound 32. The outer surfaces of the plastic encapsulation define outer surfaces of the package. The plastic encapsulation 32 and leadframe 13 conform to a known standard Power-SO package. The lower surfaces 33 of the two device carrier portions 25, 26 and the lower surfaces 33 of the leads 20 are not encapsulated by the plastic encapsulation compound 32 and provide outer contact surfaces of the electronic component 10. The electronic component 10 is a surface mountable device as exemplified in the embodiment illustrated in FIGS. 1 and 2.

The electronic component 10 comprises two semiconductor devices 11, 12 whose first load electrodes 17 (sources) are electrically connected to one another and to a lead 23 of the leadframe 13 by a single electrically conductive element in the form of a contact clip 14. The contact clip 14 may be provided in the form of a metal strip having the lateral size and shape and vertical form adapted to extend between the first load electrodes 17 of two semiconductor devices 11, 12 and the upper surface 35 of a lead 23 of a leadframe 13. In this embodiment, the leadframe 13 is positioned within the electronic component at a level below the first side of the semiconductor devices 11, 12. The upper surface of the lead 23 may lie generally coplanar with the second side 16 of the semiconductor devices 11, 12. The contact clip 14 may have a general form and height adapted to accommodate the thickness of the semiconductor devices 11, 12. Typically, the device carrier portion 19 and the leads 20 of the leadframe 13 are stamped or etched form a metal sheet so that the upper side 35 of the device carrier portion 19 and the upper side 35 of the leads 20 are generally coplanar with one another. The lower surface 33 of the device carrier portion 19 and the lower surface 33 of the leads 20 may be generally coplanar with one another so as to provide a surface mountable or leadless type electronic component. Alternatively, the outer portions of the leads may be bent in a general direction away from the first side of the two semiconductor devices to provide pins by which the electronic component 10 may be mounted on a redistribution board such as a printed circuit board.

The lower surface 22 of the contact clip 14 may comprise contact areas 34 adapted to be positioned on the first load electrodes 17 of the two semiconductor devices 11, 12 and on the upper surface 35 of the joining member 29 of the lead 23 of the leadframe 13. The contact areas 34 may be provided with a surface which is wettable by soft solder and which enables a reliable soft solder connection to be formed between the contact clip 14 and the first load electrodes 17 of the semiconductor devices 11, 12 and the lead 23 of the leadframe 13. This surface may be provided by a layer of a metal or alloy which is wettable by soft solder. For example, the leadframe 13 may comprise copper and the contact areas 34 may comprise an outer surface of nickel.

The two semiconductor devices 11, 12 of the electronic component 10 are connected to the lead 23 of the leadframe 13 by a single contact clip 14. A contact clip 14 connection has an advantage over, for example, a bond wire connection in that the cross-sectional area of the connection is increased. This way, electrical resistance of the electrical connection can be reduced which can improve the performance of the electronic component. Furthermore, inductive losses can be reduced. The use of a single contact clip 14 to electrically connect two load electrodes 17 of two physically separate semiconductor devices 11, 12 with each other as well as to a common lead 23 of the leadframe 13 has the further advantage that these connections can be made in a single process step. The contact clip 14 provides a compact internal rewiring structure within the electronic component 10. A contact clip 14 providing an electrical connection between the upwardly facing side 15 of two semiconductor devices 11, 12 and the upper side 35 of a lead 23 of the leadframe 13 positioned below the opposing second side 16 of the semiconductor devices 11, 12 provides a further advantage in that the electrical connection is vertically compact, compared to, for example, a wire bond connection. This way, the height of the electronic component 10 can be reduced or thicker semiconductor devices 11, 12 may be accommodated within an electronic component 10 of given outer dimensions.

Higher integration of at least two semiconductor devices, as exemplified by two semiconductor devices 11, 12 in the embodiment of FIG. 1 is realised by the accommodation of at least two semiconductor devices within a package. The package may have a standard package outline which simplifies the integration of the electronic component in a circuit by the customer. For example, in the embodiment of the electronic component 10 illustrated in FIG. 1, the electronic component 10 has a Power SO-8 package outline.

In the present embodiment, the contact clip 14 provides a rewiring between the two semiconductor devices 11, 12 which is positioned within the package of the electronic component 10. This simplifies the rewiring structure of the redistribution board onto which the electronic component 10 will be mounted is simplifies since the portion of rewiring between the two semiconductor devices 11, 12 is provided by the contact clip 14 within the package of the electronic component 10. The space occupied, more precisely the area occupied, by the two semiconductor devices 11, 12 on the printed circuit board may be reduced by accommodating the two semiconductor devices 11, 12 in an electronic component 10 which comprises the rewiring structure between the two semiconductor devices 11, 12.

Although the electronic component 10 is illustrated in FIG. 1 as comprising two semiconductor devices 11, 12, a single contact clip may also be used for contacting three or more semiconductor devices. Furthermore, an electronic component may comprise two or more contact clips each of which extends between two or more semiconductor devices. Each contact clip may be considered a multi-chip contact clip.

The semiconductor devices 11, 12 of the electronic component 10 are illustrated in the form of vertical transistor devices. However, lateral transistor devices can also be provided in an embodiment not illustrated in the drawings. The transistor devices may also be provided in the form of p-channel MOSFET devices or IGBT devices.

It should be noted that objects of the same or similar functional properties are denoted with the same reference signs in the drawings. Unless explicitly noted otherwise, the description with respect to objects with similar or equal functional properties can be exchanged with respect to each other.

FIG. 2*a* illustrates a cross-sectional view along the line A-A' and FIG. 2*b* illustrates a cross-sectional view along the line B-B' of the electronic component 10 illustrated in plan view in FIG. 1. The arrangement of the plastic encapsulation compound 32 and the semiconductor devices 11, 12, which, in this embodiment, are both vertical n-channel MOSFET devices, is illustrated in a cross-sectional view of FIG. 2*a* and 2*b*. The upper surface 21 of the contact clip 14 is embedded in the plastic encapsulation compound 32. More precisely, the upper surface 21 of both the web portion 27 and of the leg portion 28 of contact clip 14 is embedded within the plastic encapsulation compound 32.

The form of the contact areas 34 provided on the lower surface 22 of the web portion 27 of the contact clip 14 is also illustrated in more detail in FIG. 2*a* and 2*b*. The contact areas 34 comprise a region 36 which protrudes from the lower surface 22 of the web portion 27 of the contact clip 14. The contact clip 14 is provided by a metal foil. The protruding regions 36 can be formed by plastically deforming the metal foil, for example by pressing the upper surface 21, so that the thickness of the contact clip 14 is generally uniform over the extent of the contact clip 14. The protruding regions 36 which provide the contact areas 34 are further provided with a nickel coating 37 which is easily wettable by solder. This enables the contact clip 14 to the mounted on the first electrode 17 of the two semiconductor devices 11, 12 by soft solder joints.

The contact clip 14 further comprises a third protruding region 36, illustrated in the cross-sectional view of FIG. 2*b*, which protrudes from the lower surface 21 and which provides a contact area 34 adapted to be positioned on the upper surface 35 of the joining member 29 of the lead 23. The third protruding region 36 is also provided with a solder wettable layer 37.

The cross-sectional view of FIG. 2*a* of the electronic component 10 also illustrates that the lower surface 33 of each of the device carrier portions 25, 26 of the leadframe 13 protrudes from the plastic encapsulation compound 32, more precisely from the lower surface of the plastic encapsulation compound 32 and may provide contact areas, more precisely, a first drain contact D1 and a second drain contact D2 of the electronic component 10, respectively.

An embodiment for manufacturing an electronic component 10 comprises providing at least two semiconductor devices 11, 12, each comprising a first electrode 17, providing a leadframe 13 comprising a device carrier portion 19 and a plurality of leads 20, mounting the at least two semiconductor devices 11, 12 on the device carrier portion 20 of the leadframe 13 and connecting the first electrode 17 of the at least two semiconductor devices 11, 12 to the at least one lead of the leadframe 13 with a single contact clip 14.

The contact clip 14 may be manufactured by pressing and stamping the contact clip 14 from a sheet of the desired metal.

The contact clip 14 may be connected to the first electrode 17 of the semiconductor devices 11, 12 by soft soldering, diffusion soldering or electrically conductive adhesive. The semiconductor devices 11, 12 may be mounted on the device carrier portion 19 of the leadframe 13 by soft solder, diffusion solder or a die attach material.

The semiconductor devices 11, 12 may be encapsulated in plastic encapsulation by a molding process.

The electronic component 10 may be manufactured by providing at least two semiconductor devices 11, 12 each comprising a first side 15 and a second side 16 which opposes the first side 15. The first side 15 of the at least two semiconductor devices comprises a first load electrode 17. The first side 15 of at least one semiconductor device 11 further comprises a control electrode 18. A leadframe 13 is provided which comprises a device carrier portion 19 and a plurality of leads 20. The plurality of leads 20 are arranged at a distance from the device carrier portion 19. The second side 16 of the at least two semiconductor devices 11, 12 is mounted on the device carrier portion 19 of the leadframe 13. A contact clip 14 is provided which is adapted to extend between the first side 15 of at least two semiconductor devices 11, 12 and at least one lead 23 of the leadframe 13. The first load electrode 17 and of the least two semiconductor devices 11, 12 is connected to at least one lead 23 of the leadframe 13 with the contact clip 14.

More precisely, the electronic component 10 may comprise two semiconductor devices 11, 12, each being a vertical semiconductor transistor device comprising a first side 15 with a source electrode 17 and a gate electrode 18 and a second side 16 with a drain electrode 24. In the embodiment of the FIGS. 1 and 2, the device carrier portion 19 of the leadframe 13 comprises two portions 25, 26 which are physically separate from one another. One transistor device 11, 12 is mounted on each of the device carrier portions 25, 26. More precisely, the drain electrode 24 of a first transistor device 11 is mounted on, and electrically connected to, the first device carrier portion 25 and the drain electrode 24 of a second transistor device 12 is mounted on, and electrically connected to, the second device portion 26. The contact clip 14 is adapted to extend between the first side 15 of the two semiconductor transistor devices 11,12 and the joining member 29 of the source lead 23 of the leadframe 13. More precisely, the contact clip comprises a web portion 27 which is adapted to extend between the source electrodes 17 of the first side 15 of the two semiconductor transistor devices 11, 12 such that the gate electrode 18 of each of the two semiconductor transistor devices is 11, 12 remains uncovered by the contact clip 14, more precisely the web portion 27 of the contact clip 14. The contact clip 14 including both the web portion 27 and the leg portion 28 is positioned adjacent the gate electrode 18 positioned on the first surface 15 of each of the two semiconductor transistor devices 11,12. This enables the free access to the gate electrode 18 and simplifies the provision of an electrical contact between the gate electrode 18 and a lead 31 of the leadframe 13.

The contact clip 14 may be connected to the first load electrodes 17 of the least two semiconductor devices 11, 12 and to at least one lead 23 of the leadframe 13 by soft solder connections.

The semiconductor devices 11, 12 and at least the upper surface 35 of the device carrier portion 19 and the upper surface 35 of at least portions of the leads 20 may be encapsulated by a plastic encapsulation compound 32. The outer surfaces of the plastic encapsulation compound may define the outer surfaces of the electronic component 10 and the outer surfaces of the package and are denoted by the dashed line in the view of FIG. 1.

In an embodiment, the encapsulation is carried out so that the upper surface 21 of the contact clip 14 is completely enclosed by, and embedded in, the plastic encapsulation compound 32. The contact clip 14 is completely embedded by the plastic encapsulation compound 32 which provides electrical isolation for the contact clip 14.

Alternatively, the encapsulation may be carried out so that the upper surface 21 of at least a portion of the upper surface 21 of the contact clip 14 is exposed from the plastic encapsulation compound 32. More precisely, the encapsulation may be carried out so that a portion of the upper surface 21 of the web portion 27 of the contact clip 14 is exposed from the plastic encapsulation compound 32. The encapsulation may be carried out by injection molding.

The method of manufacturing an electronic component 10 may also be carried out by providing a leadframe strip comprising a plurality of leadframes 13, which may each have a form as previously described. The leadframe strip comprises a plurality of component positions. At least two semiconductor devices 11, 12 may be mounted on each device carrier portion 19 of each leadframe 13 in the leadframe strip and then a contact clip 14 connected between the first load electrode 17 of the two semiconductor devices 11, 12 positioned in each component position of the leadframe strip. The individual electronic components 10 may be singulated from the leadframe strip after the assembly process and, more particularly, after the plastic encapsulation 32 has been formed for each electronic device 10, if this is provided.

In an embodiment, a contact clip 14 is used to provide a multichip contact between the load electrode 17 of the least two semiconductor transistor devices 11, 12 and at least one lead 23 of a leadframe 13. The contact clip 14 provides a common load contact. In an embodiment, the common load contact is a common source contact.

A leadframe is provided which comprises two device carrier portions 25, 26 and a plurality of leads 20, the plurality of leads 20 being arranged at a distance from the device carrier portions 25, 26 and which further comprises at least two semiconductor transistor devices 11, 12, each semiconductor transistor device 11, 12 comprising a first side 15 and a second side 16 which opposes the first side 15, wherein the first side 15 comprises a first load electrode 17 and a control electrode 18 and the second side 16 comprises a second load electrode, 24 wherein the second side 16 of one semiconductor transistor device 11 is mounted on one of the at least two device carrier portions 25 of the leadframe 13. A contact clip 14 adapted to extend between the first load electrodes 17 of at least two semiconductor transistor devices 11, 12 and at least one lead 23 of the leadframe 13 is provided. The first load electrode 17 of at least two semiconductor transistor devices 11, 12 is connected to at least one lead 23 of the leadframe 13 with the contact clip 14.

The contact clip 14 may be connected to the first load electrode 17 of the at least two semiconductor devices 11, 12 and the at least one lead 23 by soft solder.

FIG. 3 illustrates a circuit 100 providing synchronous rectification which comprises the electronic component 10. The electronic component 10 provides two transistors 11, 12 in which the source electrodes are electrically connected together by the contact clip 14 to provide a common source, S12. The function provided by the electronic component 10 in the circuit 100 illustrated in FIG. 3 is indicated with a dashed line 101. The circuit 100 provides a rectifier in which the transistors rectify the output voltage of the transformer 102. A source current at an input voltage of 48V is converted by the circuit 100 to an output current at a voltage of 1.5V. The circuit 100 of the embodiment of FIG. 3 provides self driven synchronous rectification driven by the secondary of the transformer 102. However, the electronic component 10 may be used in other circuits providing synchronous rectification such as phase locked loop and primary side derived synchronous rectification circuits.

FIG. 4 illustrates an electronic component 40 according to an embodiment. The electronic component 40 comprises two semiconductor devices 11, 12, a leadframe 13 and a contact clip 14. The electronic component 40 differs from the electronic component 10 which is illustrated in FIGS. 1 and 2, by the arrangement of the plastic encapsulation compound 32. In the electronic component 40, the upper surface 21 of regions of the web portion 27 of the contact clip 14 is exposed from the plastic encapsulation compound 32. The lower surface 22 of the contact lead 14, the semiconductor devices 11, 12 and the upper surface of the device carrier portions 25, 26 and the upper surface of the leads 20 are embedded in the plastic encapsulation compound 32. The exposed area 41 of the contact clip 14 provides a shorter path of thermal resistance between the semiconductor devices 11, 12 and the environment around the electronic component 40. The thermal performance of the electronic component 40 may be increased due to an improvement in the efficiency of thermal dissipation from the electronic component 40. An additional heat sink or cooling element may be positioned on the upper surface 42 of the electronic component 40. In an embodiment, an additional heat sink may be positioned directly on the exposed regions 41 of the contact clip 14. The additional heat sink may be in electrical connection with the contact clip 14 if the contact clip 14 is connected to ground potential.

FIG. 5 illustrates a top view of a component 50 according to an embodiment. The electronic component 50 comprises two semiconductor devices 51, 52 and a leadframe 13. in contrast to the embodiments of FIGS. 1 to 4, the two semiconductor devices 51, 52 are of different types. The first semiconductor device 51 is a vertical power MOSFET device comprising a first side 15 and a second side 16 which opposes the first side 15. The first side 15 of the first semiconductor device 51 comprises a large area first load electrode 17 and a small area control electrode 18. In this embodiment, the semiconductor device 51 is an n-channel power MOSFET device so that the first load electrode 17 is a source electrode and the control electrode 18 is a gate electrode. The second semiconductor device 52 is a vertical diode comprising a first surface 15 and a second surface 16 which opposes the first surface 15. The first surface 15 comprises a anode 57 and the second surface 16 comprises a cathode 58.

In the embodiment illustrated in FIG. 5, the device carrier portion 17 of the leadframe 13 comprises a single portion on which the second side 16 of both the transistor device 51 and the diode 52 are mounted. The drain electrode 24 of the power MOSFET device 51 and the cathode electrode 58 of the diode 52 are electrically connected to the device carrier portion 19. The leadframe 13 comprises a first lead 53 which protrudes from the device carrier portion 19 and which provides a drain contact. The leadframe 13 further comprises two leads 54, 55 which are spaced at a distance from the side edge of the device carrier portion 19 from which the drain contact 53 protrudes. One lead 54, 55 is positioned on each side of the drain lead 53. The gate electrode 18 of the transistor device 51 is electrically connected to a drain lead 54 by a bond wire 56. The first load electrode 17 of the transistor device 51 is electrically connected to the anode 57 of the diode 52 and to the remaining third lead 55 of the leadframe 13 by a contact clip 59. The contact clip 59 comprises a web portion 60 which extends between the first load electrode 17 of the transistor 51 and the anode 57 of the diode. A leg portion 61 extends from the web portion 60 such that the distal end of the leg portion 61 is positioned on the upper surface 63 of the lead 55 which provides a source/anode lead. The diode 52 is electrically connected in parallel with the MOSFET device 51 and, more particularly, the diode 52 is a freewheeling diode.

The electronic component 50 provides a multi-chip module comprising a transistor 51 coupled in parallel with a freewheeling diode 52 which can be used in known circuits. The electronic component 50 may be used as part of the circuit to provide a full bridge to drive an ac motor, for example. If a three phase ac motor is to be driven, the full bridge comprises six electronic components 50. The electronic component 50 may also be used in a half bridge circuit for driving a dc motor.

Of the use of a single contact clip 59 to provide an electrical connection between the source electrode 17 of the transistor 51, the anode 57 of the diode 52 and a common lead 55 provides an electronic component 50 with a compact internal rewiring structure. The use of a contact clip 59 provides an electrically conductive contact element with a large cross-sectional area and a low resistance. Furthermore, the contact area between the contact clip 59 and the source electrode 17 of the transistor 51 and between the contact clip 59 and the anode 57 of the diode 52 may be increased so as to reduce the contact resistance. Furthermore, the electrical connection between the physically separate transistor device 51 and the diode 52 is provided by a single contact element thus simplifying the manufacture of the contacting within the electronic component 50.

The form of the contact clip 50 is selected so as to extend between the source electrode 17 of the transistor device 51, the anode 58 of the diode 52 and the common lead 55 of the leadframe 13. The lateral extent and form as well as the vertical form and the extent of the contact clip 59 may be adjusted by stamping and pressing the contact clip from a metal sheet, for example a copper sheet. The form of the web portion 60 and of the leg portion 61 may be selected so as to increase the contact area between the contact clip 59 and the source electrode 17 and anode 57 while ensuring that the gate electrode 18 of the transistor device 51 remains uncovered by the contact clip 59. The contact clip 59 may be mounted on, and electrically connected to, the source electrode 17 and anode 57 as well as the lead 55 of the lead frame 30 by, in each case, a soft solder joint.

Alternatively, the n-channel power MOSFET device 51 may be an IGBT device. The electronic component 50 may be provided in the form of a package which conforms to a standard JEDEC package type, such as a TO-type package, for example, a TO-252 package.

While the foregoing has been particularly shown and described with reference to particular embodiment thereof, it will be understood by those skilled in the art that changes in the form and details may be made without departing from the spirit and scope thereof. It is to be understood that various changes may be made in adapting to different embodiment without departing from the broader concept disclosed herein and comprehend by the claims that follows.

What is claimed is:

1. An electronic component, comprising:

a plurality of semiconductor devices, each comprising a first side and a second side opposing the first side, wherein the first side comprises a first load electrode, wherein the first side of at least one semiconductor device of the plurality of semiconductor devices further comprises a control electrode;

a leadframe comprising a device carrier portion and a plurality of leads, the plurality of leads being arranged at distances from the device carrier portion;

wherein the second side of at least two semiconductor devices of the plurality of semiconductor devices is mounted on the device carrier portion of the leadframe, and a contact clip extending between the first side of the at least two semiconductor devices and at least one lead of the leadframe to electrically connect the first load electrode of said at least two semiconductor devices to said at least one lead.

2. The electronic component according to claim 1, wherein the contact clip comprises a web portion providing a contact to the first load electrode of said at least two semiconductor devices and at least one leg portion protruding from the web portion and providing a contact to the at least one lead.

3. An electronic component, comprising:

a plurality of semiconductor devices, each comprising a first side and a second side opposing the first side, wherein the first side comprises a first load electrode, wherein the first side of at least one semiconductor device of the plurality of semiconductor devices further comprises a control electrode;

a leadframe comprising a device carrier portion and a plurality of leads, the plurality of leads being arranged at distances from the device carrier portion;

wherein the second side of at least two semiconductor devices of the plurality of semiconductor devices is mounted on the device carrier portion of the leadframe, and a contact clip extending between the first side of the at least two semiconductor devices and at least one lead of the leadframe to electrically connect the first load electrode of said at least two semiconductor devices to said at least one lead; and wherein the contact clip comprises a general T-shape.

4. An electronic component, comprising:

a plurality of semiconductor devices, each comprising a first side and a second side opposing the first side, wherein the first side comprises a first load electrode, wherein the first side of at least one semiconductor device of the plurality of semiconductor devices further comprises a control electrode;

a leadframe comprising a device carrier portion and a plurality of leads, the plurality of leads being arranged at distances from the device carrier portion;

wherein the second side of at least two semiconductor devices of the plurality of semiconductor devices is mounted on the device carrier portion of the leadframe, and a contact clip extending between the first side of the at least two semiconductor devices and at least one lead of the leadframe to electrically connect the first load electrode of said at least two semiconductor devices to said at least one lead;

wherein the contact clip comprises a web portion and at least one leg portion protruding from the web portion and; wherein the lower surface of the web portion comprises two contact areas adapted for providing a contact to the load electrode of said at least two semiconductor devices and the lower surface of the leg portion comprises a contact area adapted for providing a contact to the upper surface of at least one lead of the leadframe.

5. An electronic component, comprising:

two semiconductor devices, each comprising a first side and a second side opposing the first side, wherein the first side comprises a first load electrode, and wherein the first side of at least one semiconductor device further comprises a control electrode;

a leadframe comprising two device carrier portions, which are physically separate from one another, and a plurality of leads, the plurality of leads being arranged at distances from the device carrier portions;

wherein the second side of one of the two semiconductor devices is mounted on each of the two device carrier portions of the leadframe, and a contact clip extending between the first sides of the two semiconductor devices and at least one lead of the leadframe to electrically connect the first load electrodes of the two semiconductor devices to said at least one lead.

6. The electronic component according to claim 5, wherein the two semiconductor devices are transistors, wherein the first side of the transistors comprises a first load electrode and a control electrode.

7. The electronic component according to claim 6, wherein the web portion of the contact clip is positioned on the first load electrode of the two transistors and the control electrodes of the two transistors are uncovered by the contact clip.

8. The electronic component according to claim 6, wherein the first load electrode of each of the two transistors is a source electrode.

9. The electronic component according to claim 6, wherein the two transistors are one of a vertical transistor and a lateral transistor.

10. The electronic component according to claim 1, wherein one of said at least two semiconductor devices is a transistor and one of said at least two semiconductor devices is a diode.

11. The electronic component according to claim 10, wherein the diode is a free-wheeling diode.

12. The electronic component according to claim 1, further comprising plastic encapsulation compound, the plastic encapsulation compound encapsulating the semiconductor devices.

13. The electronic component according to claim 12, wherein the contact clip comprises an upper side and a lower side, the upper side of the contact clip being embedded in the plastic encapsulation compound.

14. The electronic component according to claim 12, wherein the contact clip comprises an upper side and a lower side, the upper side of at least a portion of the contact clip being free of the plastic encapsulation compound.

15. An electronic component, comprising:

a plurality of semiconductor transistor devices, each comprising a first side and a second side opposing the first side, wherein the first side comprises a first load electrode and a control electrode and the second side comprises a second load electrode;

a leadframe comprising two device carrier portions and a plurality of leads, the plurality of leads being arranged at a distance from the device carrier portion;

wherein the second side of one of the plurality of semiconductor transistor devices is mounted on each of two device carrier portions of the leadframe, a contact clip extending between the first side of at least two semiconductor transistor devices of said plurality of semiconductor devices and at least one lead of the leadframe to electrically connect the first load electrode of the at least two semiconductor transistor devices to the at least one lead, plastic encapsulation encapsulating the semiconductor transistor devices, at least portions of the upper surface of the device carrier portions and at least portions of the upper surface of the plurality of leads.

16. The electronic component according to claim 15, wherein at least two semiconductor devices are one of a MOSFET and an IGBT and the first load electrode is a source electrode.

17. The electronic component according to claim 15, wherein the contact clip is fully encapsulated by the plastic encapsulation.

18. The electronic component according to claim 15, wherein the contact clip is positioned within the package so that a surface of the contact clip is uncovered by the plastic encapsulation.

19. A circuit, comprising:

a plurality of semiconductor transistor devices, each comprising a first side and a second side opposing the first side, wherein the first side comprises a first load electrode and a control electrode and the second side comprises a second load electrode, and a contact clip extending between the first load electrode of at least two semiconductor transistors devices of said plurality of semiconductor transistor devices and providing a common contact, wherein the circuit is adapted to provide synchronous rectification.

20. The circuit according to claim 19, wherein the plurality of semiconductor transistor devices are one of n-channel devices or p-channel devices.

21. The electronic component of claim 1 wherein at least two of the plurality of semiconductor devices are mounted on the device carrier portion of the leadframe and positioned laterally adjacent to each other.

22. The electronic component of claim 1 wherein the second sides of at least two of the plurality of semiconductor devices are mounted directly on the device carrier portion of the leadframe.

23. The electronic component of claim 1 wherein the plurality of leads are positioned laterally adjacent the device carrier portion of the leadframe.

* * * * *